(12) United States Patent
Wada et al.

(10) Patent No.: US 12,117,497 B2
(45) Date of Patent: Oct. 15, 2024

(54) BATTERY STATUS ESTIMATION APPARATUS AND BATTERY CONTROL APPARATUS

(71) Applicant: Vehicle Energy Japan Inc., Hitachinaka (JP)

(72) Inventors: Yosuke Wada, Hitachinaka (JP); Keiichiro Ohkawa, Hitachinaka (JP)

(73) Assignee: Vehicle Energy Japan Inc., Hitachinaka (JP)

( * ) Notice: Subject to any disclaimer, the term of this patent is extended or adjusted under 35 U.S.C. 154(b) by 817 days.

(21) Appl. No.: 17/264,440

(22) PCT Filed: Mar. 18, 2019

(86) PCT No.: PCT/JP2019/011056
§ 371 (c)(1),
(2) Date: Jan. 29, 2021

(87) PCT Pub. No.: WO2020/026509
PCT Pub. Date: Feb. 6, 2020

(65) Prior Publication Data
US 2021/0311127 A1    Oct. 7, 2021

(30) Foreign Application Priority Data

Jul. 30, 2018 (JP) .................. 2018-142471

(51) Int. Cl.
*G01R 31/3842*   (2019.01)
*G01R 31/367*    (2019.01)
(Continued)

(52) U.S. Cl.
CPC ....... *G01R 31/3842* (2019.01); *G01R 31/367* (2019.01); *G01R 31/388* (2019.01);
(Continued)

(58) Field of Classification Search
CPC .................................................. H02J 7/0048
See application file for complete search history.

(56) References Cited

U.S. PATENT DOCUMENTS 10,955,479 B2 *   3/2021   Nakao ................... B60L 3/0046
2010/0085009 A1   4/2010   Kang et al.
(Continued)

FOREIGN PATENT DOCUMENTS

JP         2011-530697 A         12/2011

OTHER PUBLICATIONS

International Search Report (PCT/ISA/210) issued in PCT Application No. PCT/JP2019/011056 dated Jun. 4, 2019 with English translation (four pages).
Japanese-language Written Opinion (PCT/ISA/237) issued in PCT Application No. PCT/JP2019/011056 dated Jun. 4, 2019 (three pages).

*Primary Examiner* — Drew A Dunn
*Assistant Examiner* — Tynese V McDaniel
(74) *Attorney, Agent, or Firm* — Crowell & Moring LLP

(57) ABSTRACT

An apparatus coupled to an assembled battery with a plurality of serially-connected cells and for setting any one of the plurality of cells as a target cell and estimating a state of charge of the target cell includes: a cell voltage acquisition unit that acquires a measurement result of a closed circuit voltage of the target cell; a reference cell information acquisition unit that sets a reference cell with respect to the plurality of cells and acquires a closed circuit voltage and an open circuit voltage of the reference cell and a reference SOC value representing a state of charge of the reference cell; a temporary SOC operation unit that finds a temporary SOC value representing a temporary state of charge of the target cell on the basis of the closed circuit voltage of the target cell and the closed circuit voltage and the open circuit voltage of the reference cell; and an SOC operation unit that
(Continued)

finds an SOC value representing the state of charge of the target cell by using a result of smoothing processing executed on a difference between the temporary SOC value and the reference SOC value.

10 Claims, 13 Drawing Sheets

(51) Int. Cl.
 *G01R 31/388* (2019.01)
 *G01R 31/396* (2019.01)
 *H01M 10/48* (2006.01)
 *H02J 7/00* (2006.01)

(52) U.S. Cl.
 CPC .......... *G01R 31/396* (2019.01); *H01M 10/48* (2013.01); *H02J 7/0049* (2020.01); *H02J 2310/48* (2020.01)

(56) References Cited

U.S. PATENT DOCUMENTS

| | | | | |
|---|---|---|---|---|
| 2014/0055100 | A1* | 2/2014 | Igarashi | H02J 7/00 320/152 |
| 2015/0301115 | A1* | 10/2015 | Ohkawa | G01R 31/388 324/426 |
| 2016/0097819 | A1* | 4/2016 | Ohkawa | G01R 31/389 324/430 |
| 2018/0074129 | A1* | 3/2018 | Nakao | B60L 50/60 |
| 2018/0375176 | A1* | 12/2018 | Sakabe | H02J 7/00714 |
| 2019/0004115 | A1* | 1/2019 | Nakamura | G01R 31/392 |
| 2019/0181663 | A1* | 6/2019 | Nishikawa | H02J 7/0048 |
| 2021/0336299 | A1* | 10/2021 | Matthey | H02J 7/007188 |
| 2021/0341541 | A1* | 11/2021 | Akatsu | G01R 31/3842 |
| 2022/0003822 | A1* | 1/2022 | Naito | H02J 7/0048 |

* cited by examiner

BATTERY STATUS ESTIMATION APPARATUS AND BATTERY CONTROL APPARATUS

TECHNICAL FIELD

The present invention relates to a battery status estimation apparatus and a battery control apparatus.

BACKGROUND ART

With an apparatus such as a battery system, a distributed power storage apparatus, and an electric vehicle in which a power storage means such as a lithium secondary battery, a nickel-hydrogen battery, a lead battery, and an electric double layer capacitor is used, a status detection apparatus that detects the status of the power storage means is used to use the power storage means safely and effectively. Regarding the status of the power storage means, there are, for example, the state of charge (SOC: State of Charge) indicating to what degree the power storage means is charged or to what degree the dischargeable electric charges remain and the state of health (SOH: State of Health) indicating to what degree the power storage means has degraded.

The SOC in the battery system for, for example, portable equipment and an electric vehicle can be detected by integrating a discharging current from the fully-charged state and calculating a ratio of the remaining electric charges (remaining capacity) in the power storage means to the maximum chargeable electric charges (full capacity). Besides this method, the SOC can be also detected by defining the relationship between a voltage across the battery (an open circuit voltage) and the remaining capacity of the battery in a data table or the like in advance and calculating the current remaining capacity with reference to this data table. Furthermore, the SOC can be also found by combining these methods.

PTL 1 indicated below describes a cell balancing apparatus which is an apparatus for balancing a plurality of cells included in a battery pack and uses voltage change behaviors of battery cells, wherein the cell balancing apparatus includes: an open circuit voltage estimation means of estimating an open circuit voltage of each cell on the basis of the voltage change behaviors including a cell voltage at present and a cell voltage in the past by measuring voltages of each cell; an SOC estimation means of estimating the SOC of each cell from the open circuit voltage; and a cell balancing means of comparing the estimated SOC of the respective cells and selecting a cell which requires balancing, and balancing the SOC of the cell by controlling a balancing circuit corresponding to the selected cell.

CITATION LIST

Patent Literature

PTL 1: Japanese Unexamined Patent Application Publication No. 2011-530697

SUMMARY OF THE INVENTION

Problems to be Solved by the Invention

The technology described in PTL 1 mentioned above requires, for example, measurement of the temperature of each cell, a mathematical model which defines the correlation between change behaviors relative to the cell voltages and an open circuit voltage change amount, and a correction factor corresponding to the temperature of each cell in order to estimate the open circuit voltage of each cell. Therefore, the hardware configuration for realizing these requirements becomes complicated, which leads to an increase of manufacturing cost.

In order to solve the above-described problem of the conventional technology, it is an object of the present invention to provide a battery status estimation apparatus capable of estimating the state of charge of the battery at low cost and with high accuracy.

Means to Solve the Problems

A battery status estimation apparatus according to the present invention is an apparatus coupled to an assembled battery with a plurality of serially-connected cells and for setting any one of the plurality of cells as a target cell and estimating a state of charge of the target cell, wherein the apparatus includes: a cell voltage acquisition unit that acquires a measurement result of a closed circuit voltage of the target cell; a reference cell information acquisition unit that sets a reference cell with respect to the plurality of cells and acquires a closed circuit voltage and an open circuit voltage of the reference cell and a reference SOC value representing a state of charge of the reference cell; a temporary SOC operation unit that finds a temporary SOC value representing a temporary state of charge of the target cell on the basis of the closed circuit voltage of the target cell and the closed circuit voltage and the open circuit voltage of the reference cell; and an SOC operation unit that finds an SOC value representing the state of charge of the target cell by using a result of smoothing processing executed on a difference between the temporary SOC value and the reference SOC value.

A battery control apparatus according to the present invention includes: the battery status estimation apparatus; and a balancing control apparatus for controlling balancing of the assembled battery on the basis of the SOC value of each cell which is found by the battery status estimation apparatus.

Advantageous Effects of the Invention

The battery status estimation apparatus capable of estimating the state of charge of the battery at low cost and with high accuracy can be provided according to the present invention.

DESCRIPTION OF EMBODIMENTS

First Embodiment

Figure 1:
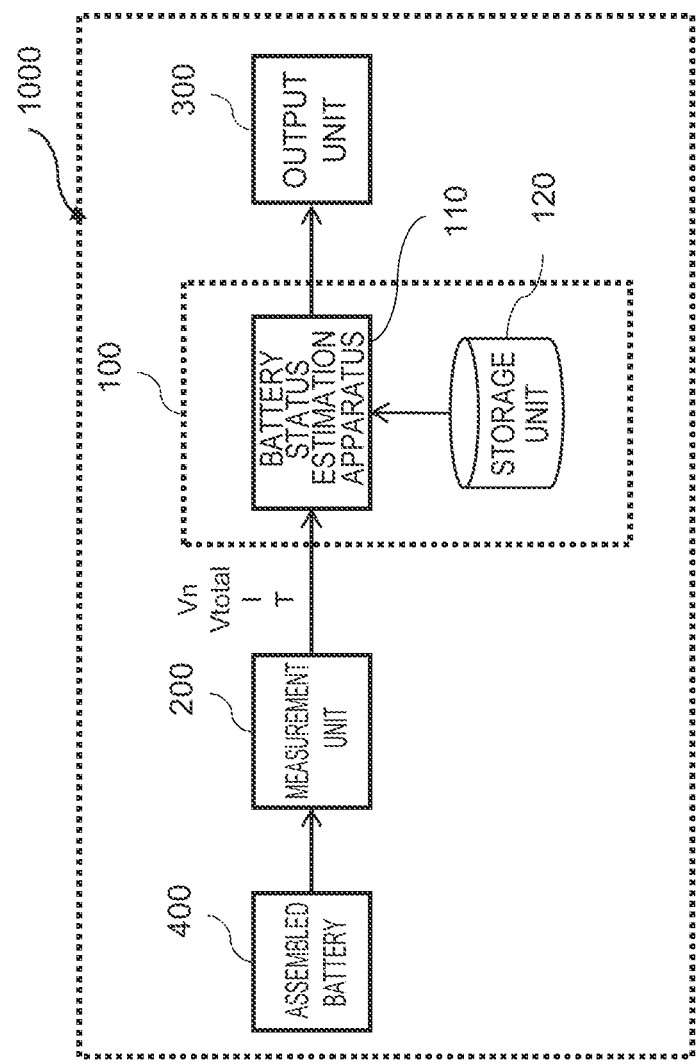
FIG. 1 is a block diagram illustrating the configuration of a battery system according to one embodiment of the present invention.

FIG. 1 is a block diagram illustrating the configuration of a battery system 1000 according to one embodiment of the present invention. The battery system 1000 is a system for supplying electric charges, which are accumulated by an assembled battery 400, as electric power to an external apparatus and includes a battery control apparatus 100, a measurement unit 200, and an output unit 300. A possible target to which the electric power is supplied by the battery system 1000 includes, for example, electric vehicles, hybrid automobiles, and trains.

The assembled battery 400 is, for example, a chargeable-dischargeable battery such as a lithium-ion secondary battery. Besides this, the present invention can be also applied to a device having a battery energy storage function such as a nickel-hydrogen battery, a lead battery, and an electric double layer capacitor. In this embodiment, the assembled battery 400 is configured by serially connecting a plurality of single cells (hereinafter simply referred to as the "cells").

The measurement unit 200: is a function unit that measures physical properties of the assembled battery 400, for example, a cell voltage $V_n$ (n=1 to Nmax, where Nmax represents the total number of cells of the assembled battery 400) which is a voltage across each of the cells constituting the assembled battery 400, a total voltage Vtotal which is a voltage across the entire assembled battery 400, a battery current I which is an electric current flowing through the respective cells of the assembled battery 400 in common, and a battery temperature T indicating the temperature of the assembled battery 400; and is configured of sensors for measuring the respective values, a required electric circuit, and so on. Incidentally, an internal resistance R of the assembled battery 400 is also required in order to estimate the battery status as described later; however, in this embodiment, a battery status estimation apparatus 110 calculates it by using other measurement parameters.

The output unit 300 is a function unit that outputs an output of the battery control apparatus 100 to an external apparatus (for example, a host apparatus such as a vehicle control apparatus which an electric vehicle is equipped with).

The battery control apparatus 100 is an apparatus for controlling actions of the assembled battery 400 and includes the battery status estimation apparatus 110 and a storage unit 120.

The battery status estimation apparatus 110 calculates the SOC of each cell of the assembled battery 400 on the basis of the cell voltage $V_n$, the total voltage Vtotal, the battery current I, and the battery temperature T which are measured by the measurement unit 200, and characteristic information of the assembled battery 400 stored in the storage unit 120. The details of a method for calculating the SOC will be explained later.

The storage unit 120 stores the characteristic information which can be known in advance such as the internal resistance R, a polarization voltage $V_p$, charging efficiency, a permissible electric current, and a full capacity of each cell of the assembled battery 400. Regarding this characteristic information, the relevant value may be stored individually for each charging/discharging action, the relevant value may be stored individually for each state of each cell such as the state of charge and the temperature, or one common value for all the states of each cell may be stored.

The battery control apparatus 100 and the battery status estimation apparatus 110 can be configured by using hardware such as circuit devices for implementing their functions. Also, the battery control apparatus 100 and the battery status estimation apparatus 110 can be configured by execution of software equipped with such functions by an arithmetic operation apparatus such as a CPU (Central Processing Unit). In the latter case, the relevant software is stored in, for example, the storage unit 120.

The storage unit 120 is configured by using a storage device(s) such as a flash memory, an EEPROM (Electrically Erasable Programmable Read-Only Memory), and a magnetic disk. The storage unit 120 may be provided outside the battery status estimation apparatus 110 or may be implemented as a memory device provided inside the battery status estimation apparatus 110. The storage unit 120 may be designed to be detachable. If the storage unit 120 is designed to be detachable, the characteristic information and the software can be changed easily by replacing the storage unit 120. Furthermore, the characteristic information and the software can be updated on a small unit basis by providing a plurality of storage units 120 and storing and distributing the characteristic information and the software in the replaceable storage units 120.

Figure 2:
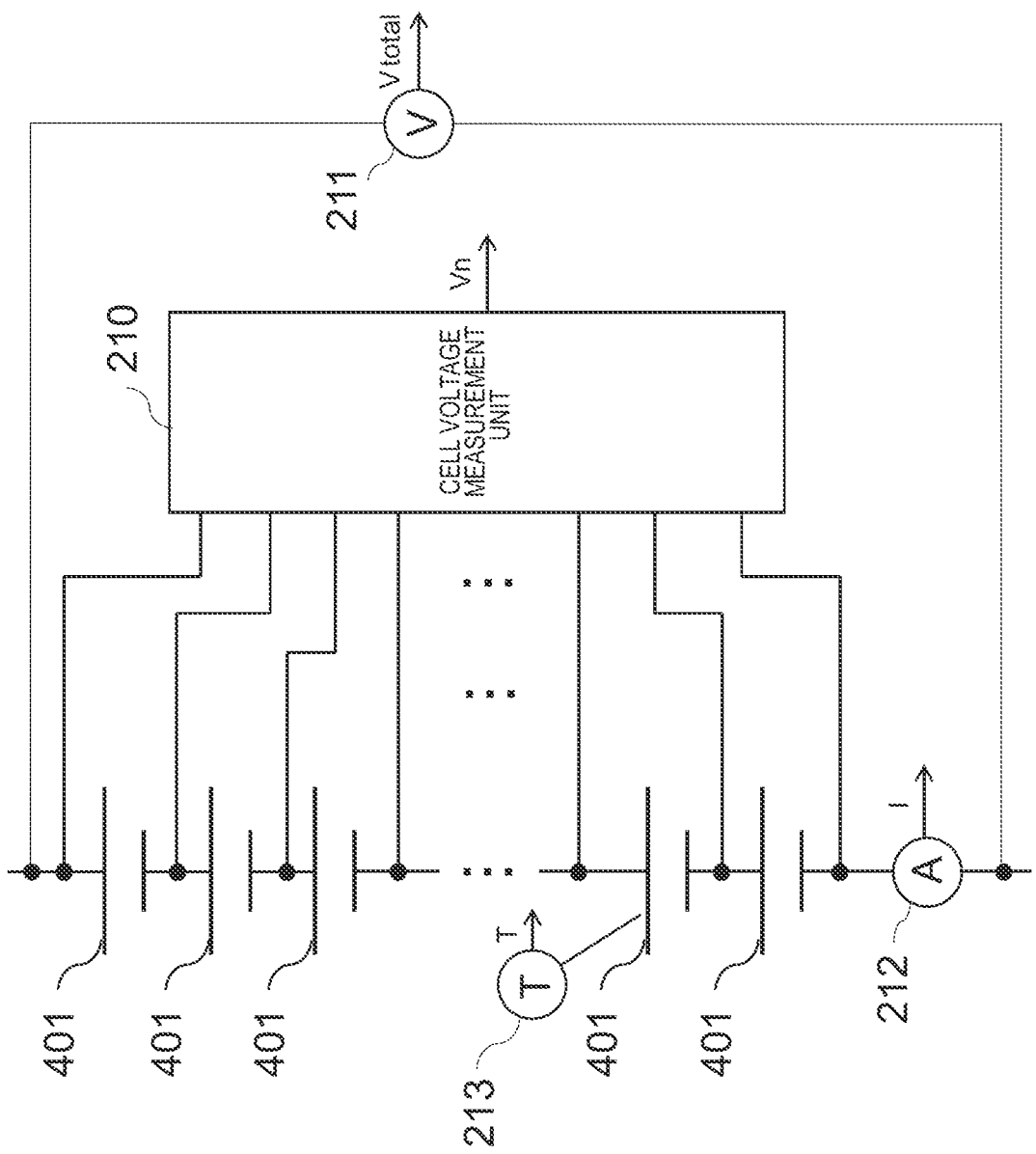
FIG. 2 is a block diagram illustrating the details of a measurement unit and an assembled battery.

FIG. 2 is a block diagram illustrating the details of the measurement unit 200 and the assembled battery 400. The measurement unit 200 includes a cell voltage measurement unit 210, a total voltage measurement unit 211, an electric current measurement unit 212, and a temperature measurement unit 213 as illustrated in FIG. 2. With the assembled battery 400, a plurality of cells 401 are connected serially.

The cell voltage measurement unit 210 is connected to a positive electrode and a negative electrode of each cell 401, measures the cell voltage $V_n$ of each cell 401, and outputs it to the battery status estimation apparatus 110. Incidentally, the cell voltage measurement unit 210 may be configured of one piece of hardware capable of measuring the cell voltages of all the cells 401. Alternatively, the cell voltage measurement unit 210 may be configured by dividing the cells 401 into a specified number of groups and combining a plurality of pieces of hardware corresponding to the respective groups.

The total voltage measurement unit 211 is connected between the positive electrode of a cell 401 connected on the highest-order (highest electrical potential) side of the assembled battery 400 and the negative electrode of a cell 401 connected on the lowest-order (lowest electrical potential) side of the assembled battery 400, measures the total voltage Vtotal of the assembled battery 400, and outputs it to the battery status estimation apparatus 110.

The electric current measurement unit 212 measures the electric current flowing through the assembled battery 400 and outputs it as the battery current I to the battery status estimation apparatus 110. Specifically speaking, since all the cells 401 are connected serially in the assembled battery 400, the electric current measurement unit 212 can measure the battery current I which flows through each cell 401 in common by measuring the electric current flowing through the assembled battery 400.

The temperature measurement unit 213 is configured by including a temperature sensor provided in the assembled battery 400, measures the battery temperature T, and outputs it to the battery status estimation apparatus 110. The temperature sensor in the temperature measurement unit 213 is installed at the position corresponding to an arbitrary cell 401 among the plurality of cells 401 which constitute the assembled battery 400. For example, the temperature sensor may be attached directly to the relevant cell 401 or the temperature sensor may be installed in the vicinity of the relevant cell 401. Furthermore, there may be one temperature sensor or a plurality of temperature sensors which are attached to separate cells 401 may be combined together and used.

Figure 3:
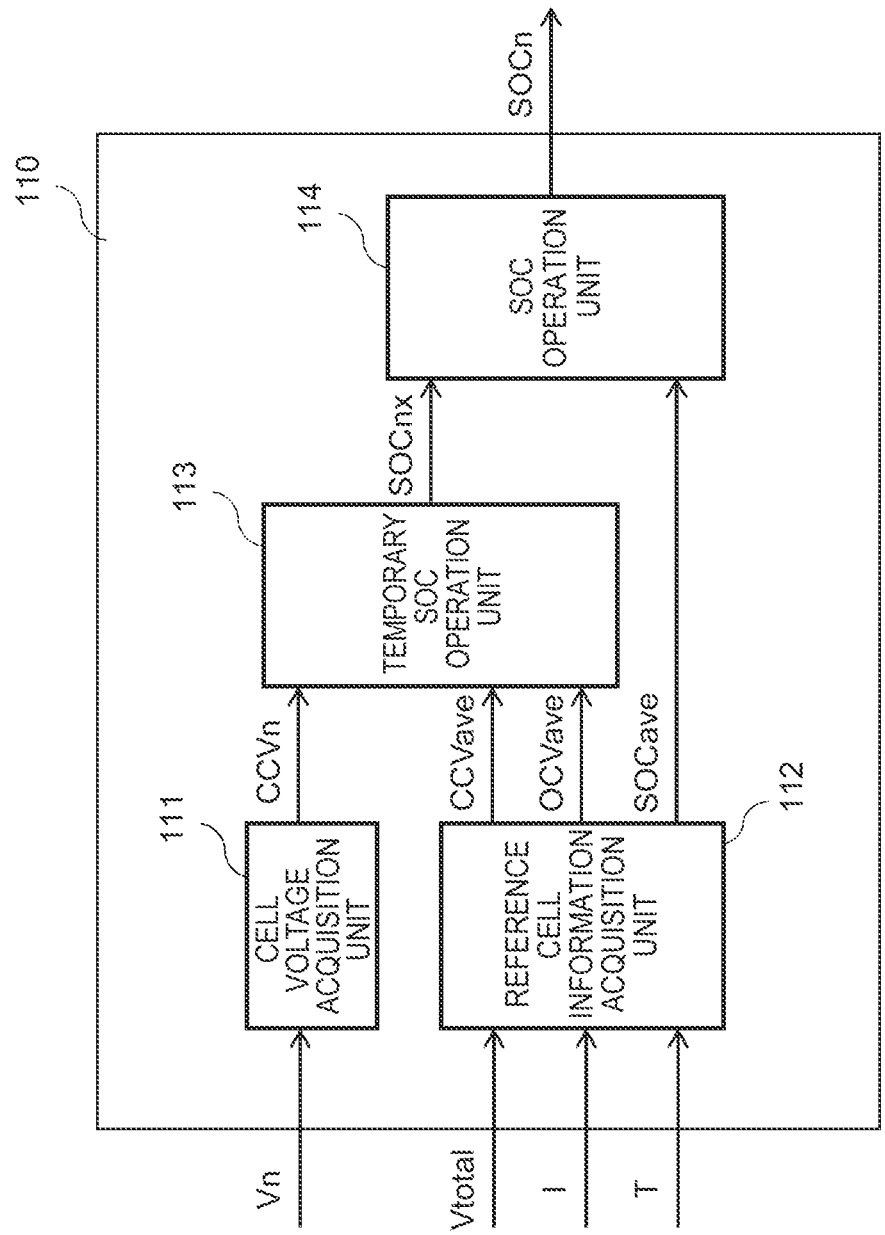
FIG. 3 is a functional block diagram illustrating the details of a battery status estimation apparatus according to a first embodiment of the present invention.

FIG. 3 is a functional block diagram illustrating the details of the battery status estimation apparatus according to the first embodiment of the present invention 110. The battery status estimation apparatus 110 according to this embodiment has the respective functional blocks of a cell voltage acquisition unit 111, a reference cell information acquisition unit 112, a temporary SOC operation unit 113, and an SOC operation unit 114 and outputs the estimation result of the state of charge with respect to each cell 401 of the assembled battery 400 as the state of cell charge SOCn (n=1 to Nmax). These respective functional blocks are implemented as, for example, hardware constituting the battery status estimation apparatus 110 and software executed by the CPU.

The cell voltage acquisition unit 111 acquires the measurement result of a closed circuit voltage (CCV) of each cell 401 by acquiring the cell voltage Vn of each cell 401 measured by the measurement unit 200 when the assembled battery 400 is in an energized state. Then, the acquired value of the CCV of each cell 401 is output as CCVn (n=1 to Nmax).

The reference cell information acquisition unit 112 sets a reference cell with respect to the plurality of cells 401, which constitute the assembled battery 400, and acquires a closed circuit voltage (CCV) and open circuit voltage (OCV) of this reference cell, and a reference SOC value indicating the state of charge of the reference cell. In this embodiment, the reference cell information acquisition unit 112 acquires average values of the CCV, the OCV, and the SOC of the respective cells 401 of the entire assembled battery 400 as the CCV, the OCV, and the reference SOC value of the reference cell on the basis of the total voltage Vtotal, the battery current I, and the battery temperature T measured by the measurement unit 200 when the assembled battery 400 is in the energized state. Then, the reference cell information acquisition unit 112 outputs these obtained values as CCVave, OCVave, and SOCave, respectively. Incidentally, a method for calculation of CCVave, OCVave, and SOCave by the reference cell information acquisition unit 112 will be explained later.

The temporary SOC operation unit 113 finds a temporary SOC value indicating a temporary state of charge of each cell 401 on the basis of the CCVn which is input from the cell voltage acquisition unit 111 and the CCVave and OCVave which are input from the reference cell information acquisition unit 112. Then, the temporary SOC operation unit 113 outputs the temporary SOC value, which has been found with respect to each cell 401, as SOCnx (n=1 to Nmax). Incidentally, a method of calculation of SOCnx by the temporary SOC operation unit 113 will be explained later.

The SOC operation unit 114 finds an SOC value indicating the state of charge of each cell 401 on the basis of the SOCnx which is input from the temporary SOC operation unit 113 and the SOCave which is input from the reference cell information acquisition unit 112. Then, the SOC operation unit 114 outputs the state of cell charge SOCn on the basis of the SOC value found with respect to each cell 401. Incidentally, a method for calculation of SOCn by the SOC operation unit 114 will be explained later.

Figure 4:
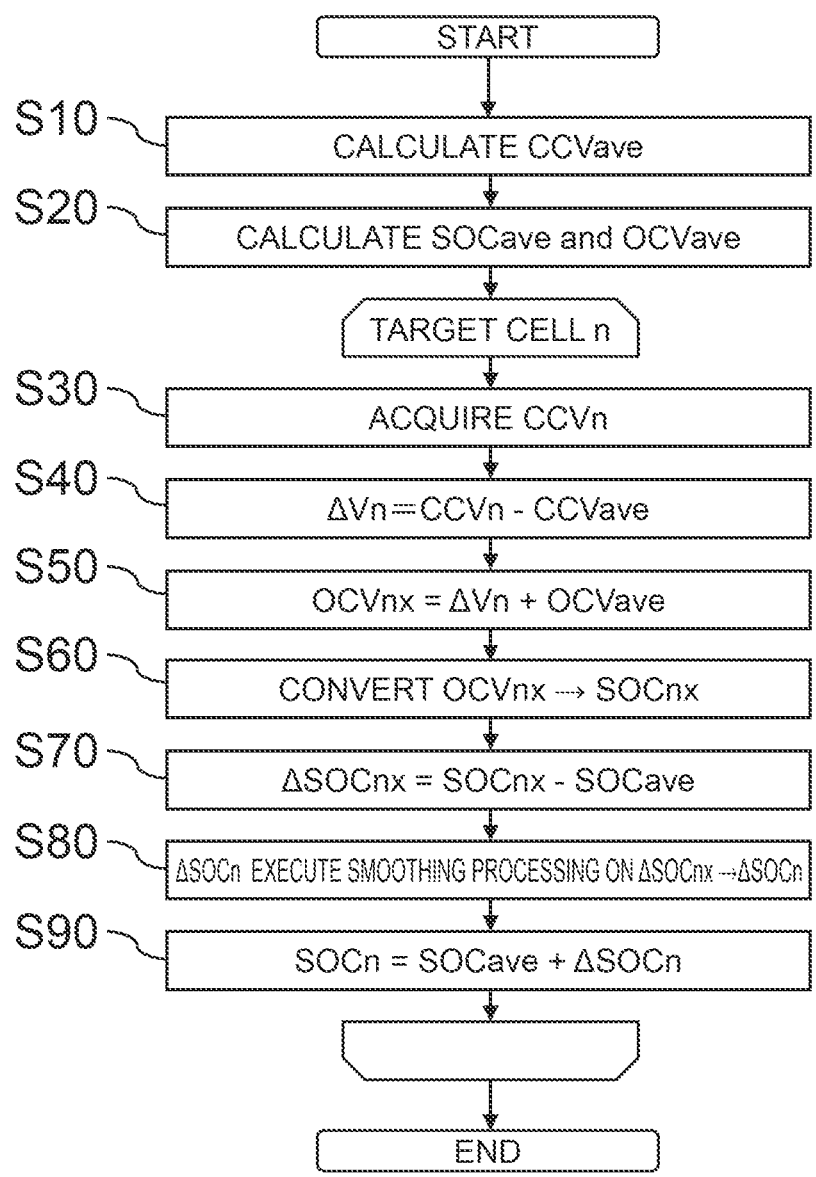
FIG. 4 is a diagram illustrating a processing flow of the battery status estimation apparatus according to the first embodiment of the present invention.

FIG. 4 is a diagram illustrating a processing flow of the battery status estimation apparatus 110 according to the first embodiment of the present invention. The battery status estimation apparatus 110 according to this embodiment estimates the state of charge of each cell 401 by executing the processing flow illustrated in FIG. 4 in every specified processing cycle when the assembled battery 400 is in the energized state.

In step S10, the reference cell information acquisition unit 112 calculates the average cell voltage CCVave per cell of the assembled battery 400. Under this circumstance, the reference cell information acquisition unit 112 calculates the CCVave by acquiring the total voltage Vtotal from the measurement unit 200 and dividing the acquired total voltage Vtotal by the number of cells of the assembled battery 400. Then, the calculated value of CCVave is output to the temporary SOC operation unit 113.

In step S20, the reference cell information acquisition unit 112 calculates the state of average cell charge SOCave of the assembled battery 400 and the average cell voltage OCVave per cell when the assembled battery 400 is in a de-energized state. Under this circumstance, the reference cell information acquisition unit 112 finds the SOC of the entire assembled battery 400 on the basis of, for example, an integration result of a known SOC value of the entire assembled battery 400 at some point in time in the past and the battery current I acquired from the measurement unit 200, thereby setting this SOC as SOCave. Then, the reference cell information acquisition unit 112 calculates OCVave by: finding the value of OCV of the assembled battery 400 corresponding to the calculated SOCave by using the relationship between the OCV and the SOC in the entire assembled battery 400 included in the characteristic information stored in the storage unit 120; and dividing the value of the OCV by the number of cells of the assembled battery 400. Then, the calculated values of OCVave and SOCave are output to the temporary SOC operation unit 113 and the SOC operation unit 114, respectively.

Alternatively, in step S20, the reference cell information acquisition unit 112 may estimate a resistance value of the entire assembled battery 400 on the basis of the battery temperature T acquired from the measurement unit 200 and calculate OCVave on the basis of the acquired resistance value and the CCVave found in step S10. In this case, the SOCave can be calculated from the calculation result of the OCVave by using the relationship between the OCV and the SOC in the entire assembled battery 400 included in the characteristic information stored in the storage unit 120. Besides this, the reference cell information acquisition unit 112 can calculate the SOCave and the OCVave by an arbitrary method.

The battery status estimation apparatus 110 executes the processing in step S30 to step S90 by sequentially targeting each cell 401 of the assembled battery 400. The content of the processing executed in steps S30 to S90 by setting the n-th cell 401 (n=1 to Nmax) as a target cell will be explained below as a specific example.

In step S30, the cell voltage acquisition unit 111 acquires the cell voltage CCVn of the target cell from the measurement unit 200. Then, the calculated value of CCVn is output to the temporary SOC operation unit 113.

In step S40, the temporary SOC operation unit 113 calculates a cell voltage difference ΔVn between the target cell and the reference cell. Under this circumstance, the temporary SOC operation unit 113 calculates the cell voltage difference ΔVn by subtracting the average cell voltage CCVave, which is input from the reference cell information acquisition unit 112 in step S10, from the cell voltage CCVn of the target cell which is input from the cell voltage acquisition unit 111 in step S30. Specifically speaking, the cell voltage difference ΔVn is calculated according to the following Expression (1) in step S40.

$$\Delta Vn = CCVn - CCVave \qquad (1)$$

In step S50, the temporary SOC operation unit 113 calculates OCVnx which is a temporary OCV value of the target cell. Under this circumstance, the temporary SOC operation unit 113 calculates the OCVnx by adding the OCVave calculated in step S20 to the cell voltage difference ΔVn calculated in step S40. Specifically speaking, the OCVnx is calculated according to the following Expression (2) in step S50.

$$OCVnx = \Delta Vn + OCVave \qquad (2)$$

In step S60, the temporary SOC operation unit 113 calculates SOCnx, which is a temporary SOC of the target cell, by converting the OCVnx calculated in step S50 to the value of SOC. Under this circumstance, the temporary SOC operation unit 113 converts OCVnx to SOCnx by using the relationship between the OCV and the SOC of each cell included in the characteristic information stored in the storage unit 120. Then, the calculated value of SOCnx is output to the SOC operation unit 114.

Figure 5:
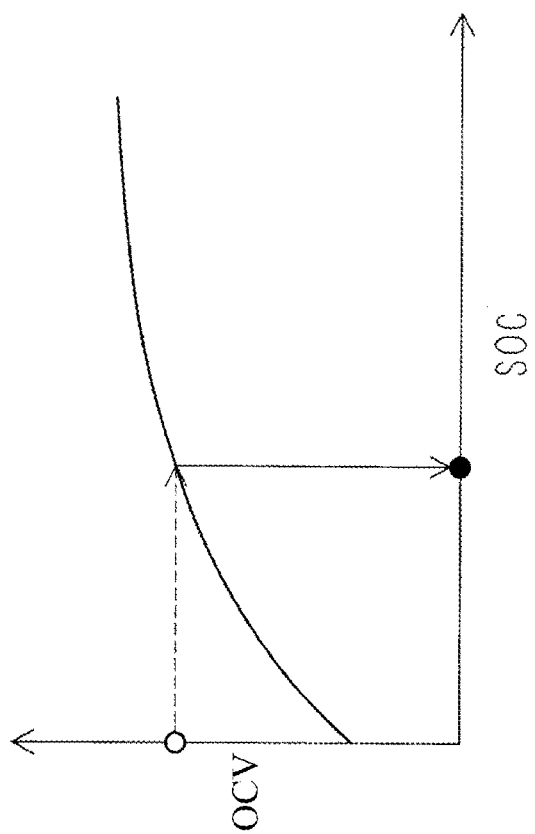
FIG. 5 is a diagram illustrating the relationship between an OCV and the SOC.

FIG. 5 is a diagram illustrating the relationship between the open circuit voltage OCV and the SOC of each cell. This correspondence relationship is determined by properties of each cell 401 in the assembled battery 400 and data which defines the correspondence relationship is stored as an SOC table in the storage unit 120 in advance. The temporary SOC operation unit 113 can calculate the SOCnx, which is the temporary SOC of the target cell, by referring to the SOC table, using the OCVnx calculated in step S50 as a key.

Incidentally, the OCVnx calculated in step S50 is calculated by using the cell voltage difference ΔVn which is found from the cell voltage CCVn of the target cell when it is energized. The SOCnx which is calculated as the temporary SOC of the target cell in step S60 is found from this OCVnx. Therefore, the SOCnx is not accurate because it contains measurement errors of the cell voltage measurement unit 210, the difference in the timing to measure CCVn of the target cell and the battery current I, and differences in the internal resistance of the respective cells (individual differences, temperature differences, differences in the degraded state, and so on). So, in this embodiment, an accurate SOC of the target cell is found from the SOCnx by the SOC operation unit 114 by performing the arithmetic operation explained below.

In step S70, the SOC operation unit 114 calculates a temporary SOC difference value ΔSOCnx of the target cell relative to the reference cell. Under this circumstance, the SOC operation unit 114 calculates the ΔSOCnx by subtracting the value of SOCave, which is input from the reference cell information acquisition unit 112 in step S20, from the value of SOCnx which is input from the temporary SOC operation unit 113 in step S60. Specifically speaking, the ΔSOCnx is found according to the following Expression (3) in step S70.

$$\Delta SOCnx = SOCnx - SOCave \qquad (3)$$

In step S80, the SOC operation unit 114 calculates a real SOC difference value ΔSOCn of the target cell relative to the reference cell by executing the smoothing processing on the temporary difference value ΔSOCnx calculated in step S70. The smoothing processing executed in step S80 is to calculate the real difference value ΔSOCn by averaging and smoothing out fluctuations of the temporary difference value ΔSOCnx in every processing cycle and thereby reducing errors and noises contained in the temporary difference value ΔSOCnx. Specifically speaking, the smoothing processing in step S80 is implemented by, for example, moving average processing or filtering processing using a specified digital filter such as a low-pass filter or a Kalman filter.

One example of the moving average processing which is executed as the smoothing processing in step S80 will be explained below. Assuming that a moving average number is N and the value of the temporary difference value ΔSOCnx which is obtained in every specified processing cycle is ASOCnx(i) (i is a natural number equal to or more than 1), the real difference value ΔSOCn after the smoothing processing executed on the temporary difference value ΔSOCnx(t) which is obtained by the most recent processing is found according to the following Expression (4), where t is larger than N (t>N).

$$\Delta SOCn = \{ASOCnx(t-N) + ASOCnx(t-(N-1)) + \ldots + ASOCnx(t-1) + ASOCnx(t)\}/N \qquad (4)$$

Incidentally, the example of the simple moving average without weighting each value of ASOCnx(i) has been explained above; however, the smoothing processing may be executed by means of the weighted moving average to increase weighting for more current values. In this case, weighting of each value can be decided according to an arbitrary processing method such as the linear weighted moving average, exponential moving average, modified moving average, or triangular moving average.

In step S90, the SOC operation unit 114 calculates the SOC value of the target cell by using the result of the smoothing processing in step S80. Under this circumstance, the SOC operation unit 114 calculates SOCn which is the SOC value of the target cell by adding the real difference value ΔSOCn after the smoothing processing as found in step S80 to the value of SOCave which is input from the reference cell information acquisition unit 112 in step S20. Specifically speaking, the SOCn is found according to the following Expression (5) in step S90.

$$SOCn = SOCave + \Delta SOCn \qquad (5)$$

After the SOCn relative to the target cell is calculated in step S90, the processing returns to step S30 and the processing in S30 to S90 is repeated. When the processing in S30 to S90 has been successfully executed on all the cells 401 as the target cell, the battery status estimation apparatus 110 terminates the processing flow in FIG. 4.

Regarding the processing in step S60, it is difficult to calculate the accurate SOC value of the target cell as the SOCnx due to various kinds of error factors as described earlier. On the other hand, when the assembled battery 400 is in the energized state, the same electric current is flowing through each cell 401 and, therefore, there is such a characteristic that the SOC difference between the respective cells 401 is stable. So, the above-described characteristic is utilized in this embodiment and the real difference value ΔSOCn is found by executing the smoothing processing on the temporary difference value ΔSOCnx, which is found according to the aforementioned Expression (3), and the SOC value of the target cell is calculated according to the aforementioned Expression (5) by using this real difference value ΔSOCn. Therefore, the SOC value of the target cell can be found accurately by simple processing without requiring any complicated arithmetic operation processing or any complicated hardware configuration.

The above-described first embodiment of the present invention brings about the following operational advantages (1) to (3).

(1) The battery status estimation apparatus 110 is an apparatus that: is coupled to the assembled battery 400 in which the plurality of cells 401 are connected serially; and sets any one of the plurality of cells 401 as the target cell and estimates the state of charge of the target cell. The battery status estimation apparatus 110 includes the cell voltage acquisition unit 111, the reference cell information acquisition unit 112, the temporary SOC operation unit 113, and the SOC operation unit 114. The cell voltage acquisition unit 111 acquires the measurement result of the closed circuit voltage CCVn of the target cell (step S30). The reference cell information acquisition unit 112 sets the reference cell with respect to the plurality of cells 401 and acquires the closed circuit voltage CCVave and the open circuit voltage OCVave of the reference cell, and the SOCave which is the reference SOC value indicating the state of charge of the reference cell (steps S10 and S20). The temporary SOC operation unit 113 finds the SOCnx which is the temporary SOC value indicating the temporary state of charge of the target cell on the basis of the closed circuit voltage CCVn of the target cell and the closed circuit voltage CCVave and the open circuit voltage OCVave of the reference cell (steps S40 to S60). The SOC operation unit 114 finds the SOCn which is the SOC value indicating the state of charge of the target cell by using the result of the smoothing processing executed on the difference ΔSOCnx between SOCnx and SOCave (steps S70 to S90). Consequently, it is possible to provide the battery status estimation apparatus 110 capable of estimating the state of charge of each cell 401 of the assembled battery 400 at low cost and with high accuracy.

(2) The smoothing processing executed in step S80 can include at least either one of the moving average processing and the filtering processing using a specified digital filter. Consequently, it is possible to reliably reduce the time change amount in the difference ΔSOCnx between SOCnx and SOCave and easily and appropriately calculate the real difference value ΔSOCn after the smoothing processing which is required to find the SOCn.

(3) In steps S10 and S20, the reference cell information acquisition unit 112 acquires the CCVave and the SOCave, which are average values of the closed circuit voltage and the state of charge of the plurality of cells 401, as the closed circuit voltage and the reference SOC value of the reference cell, respectively, and finds the OCVave as the open circuit voltage of the reference cell on the basis of the acquired SOCave. Consequently, it is possible to easily acquire the closed circuit voltage, the open circuit voltage, and the reference SOC value of the reference cell while offsetting, for example, individual differences between the respective cells 401 and measurement errors which randomly occur in each cell 401.

Second Embodiment

Next, a second embodiment of the present invention will be explained. In this embodiment, an explanation will be provided about an example where the battery status estimation apparatus 110 calculates the SOC of the target cell by executing the smoothing processing by a method different from that of the first embodiment. Incidentally, the configuration of the battery system 1000 and the configurations of the measurement unit 200 and the assembled battery 400 according to this embodiment are similar to those explained with reference to FIG. 1 and FIG. 2, respectively, so that an explanation about them is omitted below.

Figure 6:
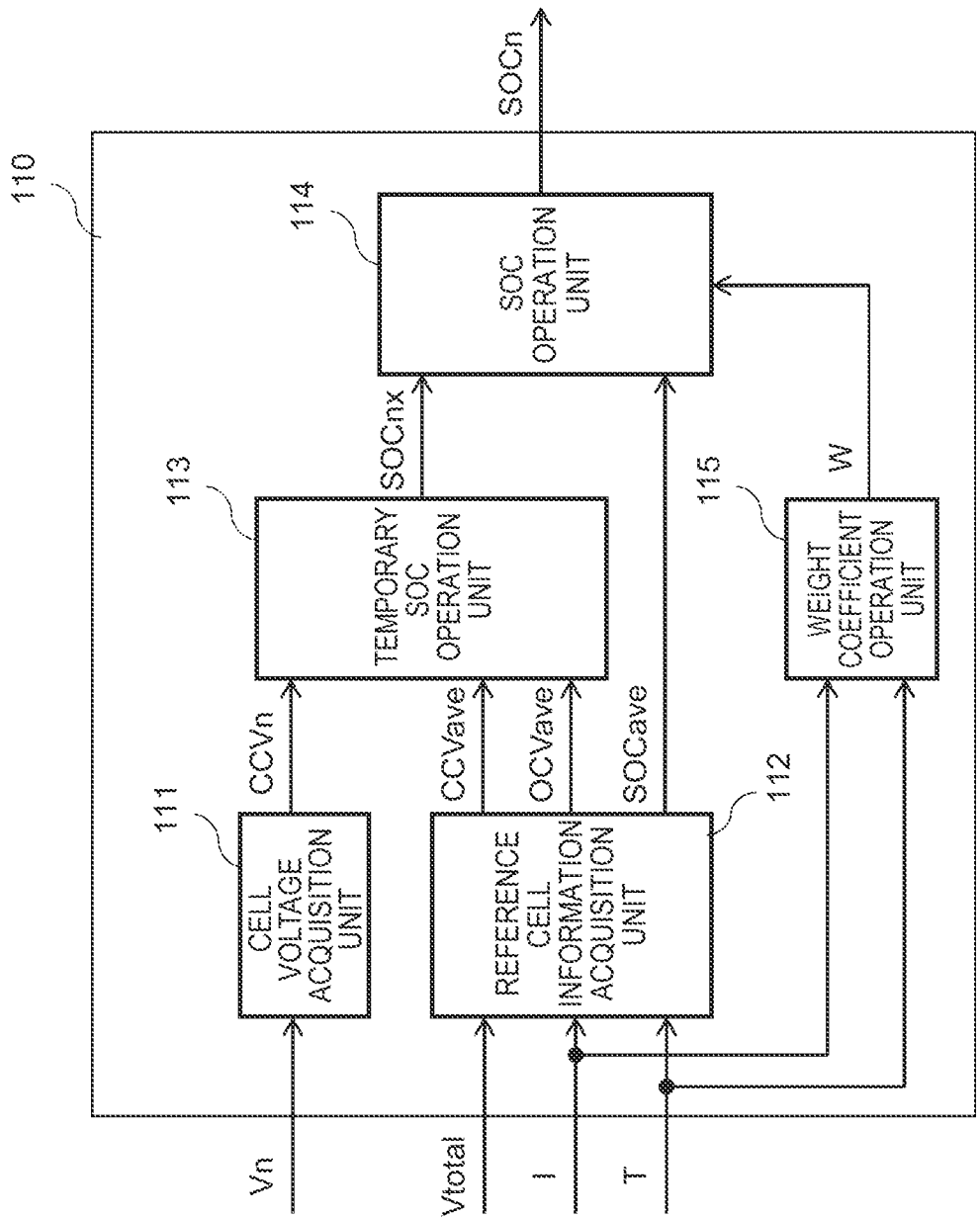
FIG. 6 is a functional block diagram illustrating the details of a battery status estimation apparatus according to a second embodiment of the present invention.

FIG. 6 is a functional block diagram illustrating the details of the battery status estimation apparatus according to the second embodiment of the present invention 110. The battery status estimation apparatus 110 according to this embodiment further includes a weight coefficient operation unit 115 in addition to the respective functional blocks of the cell voltage acquisition unit 111, the reference cell information acquisition unit 112, the temporary SOC operation unit 113, and the SOC operation unit 114 which have been explained in the first embodiment.

The weight coefficient operation unit 115 calculates a weight coefficient W on the basis of the battery current I and the battery temperature T which are measured by the measurement unit 200 when the assembled battery 400 is in the energized state. This weight coefficient W is output from the weight coefficient operation unit 115 to the SOC operation unit 114 and is used when the SOC operation unit 114 executes the smoothing processing. Incidentally, a method for calculation of the weight coefficient W by the weight coefficient operation unit 115 will be explained later.

Figure 7:
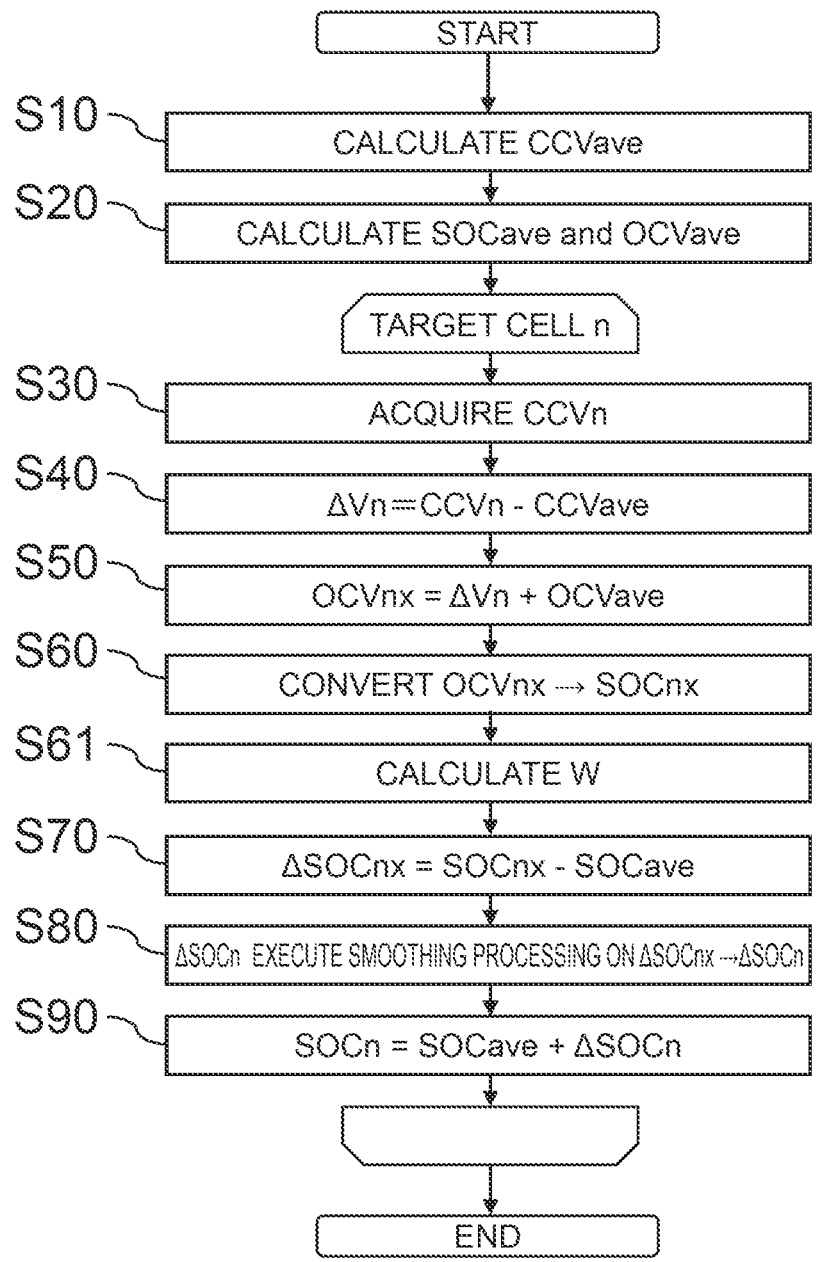
FIG. 7 is a diagram illustrating a processing flow of the battery status estimation apparatus according to the second embodiment of the present invention.

FIG. 7 is a diagram illustrating a processing flow of the battery status estimation apparatus 110 according to the second embodiment of the present invention. The battery status estimation apparatus 110 according to this embodiment estimates the state of charge of each cell 401 by executing the processing flow illustrated in FIG. 7 in every specified processing cycle when the assembled battery 400 is in the energized state.

In each of steps S10 to S60, processing similar to that explained in the first embodiment is executed.

In step S61, the weight coefficient operation unit 115 calculates the weight coefficient W. The weight coefficient operation unit 115 calculates the weight coefficient W according to, for example, the following Expression (6) on the basis of an absolute value of the battery current I which indicates the electric current flowing through the target cell and an internal resistance value of the target cell. Regarding Expression (6), R represents the internal resistance value of the target cell and G1 and G2 respectively represent behavior coefficients which characterize the behavior of the smoothing processing using the weight coefficient W. Incidentally, the relationship between the behavior coefficients G1, G2 and the behavior of the smoothing processing will be explained later.

$$W = 1/\{(1+|I| \times R \times G2) \times G1\} \quad (6)$$

The internal resistance R of the target cell is stored in advance as the characteristic information in the storage unit 120. The internal resistance R varies depending on, for example, the state of charge and the battery temperature T of the target cell, so that an individual value for each combination of these pieces of information is stored in the storage unit 120. In this embodiment, the characteristic information which defines the correspondence relationship between the internal resistance R and the battery temperature T is stored as a resistance table. The weight coefficient operation unit 115 acquires the internal resistance R from the resistance table on the basis of the battery temperature T and calculates the weight coefficient W by using Expression (6).

After the weight coefficient W is calculated by the weight coefficient operation unit 115 in step S61, the SOC operation unit 114 calculates the temporary SOC difference value ΔSOCnx of the target cell relative to the reference cell in step S70 in the same manner as explained in the first embodiment.

In step S80, the SOC operation unit 114 calculates the real SOC difference value ΔSOCn of the target cell relative to the reference cell by executing the smoothing processing on the temporary difference value ΔSOCnx calculated in step S70. Under this circumstance, the SOC operation unit 114 according to this embodiment executes the smoothing processing by weight-adding the temporary difference value ΔSOCnx before the smoothing processing, which is obtained by the processing executed this time, and the real difference value ΔSOCn after the smoothing processing, which was obtained by the processing executed last time and was used for the arithmetic operation of the SOC value of the target cell, by using the weight coefficient W calculated by the weight coefficient operation unit 115 in step S61. Specifically, when the real difference value after the smoothing processing in the processing executed this time is expressed as ΔSOCn(t) and the real difference value after the smoothing processing in the processing executed last time is expressed as ΔSOCn(t−1), respectively, the ΔSOCn(t) is calculated according to the following Expression (7).

$$\Delta SOCn(t) = W \times \Delta SOCnx + (1-W) \times \Delta SOCn(t-1) \quad (7)$$

After the real difference value ΔSOCn is calculated by executing the smoothing processing by using the weight coefficient W in step S80, the SOCn which is the SOC value of the target cell is calculated in step S90 according to the aforementioned Expression (5) by using the result of step S80. After the SOCn relative to the target cell is calculated in step S90, the processing returns to step S30 and the processing in S30 to S90 is repeated in the same manner as in the first embodiment. When the processing in S30 to S90 has been successfully executed on all the cells 401 as the target cell, the battery status estimation apparatus 110 terminates the processing flow in FIG. 7.

Now, the relationship between the behavior coefficients G1, G2 and the behavior of the smoothing processing with regard to the weight coefficient W will be explained below. The behavior coefficient G1 is a coefficient relating to the entire Expression (6) mentioned earlier and relates to the safety and update frequency of the smoothing processing. Specifically, when the value of the behavior coefficient G1 is small, the safety of the real difference value ΔSOCn(t) calculated according to Expression (7) decreases, while its update frequency is enhanced. As a result, the followability with respect to actual changes in the SOC increases instead of an expansion of a fluctuation range of the SOCn of the target cell which is calculated in every processing cycle. On the other hand, when the value of the behavior coefficient G1 is large, the safety of the real difference value ΔSOCn calculated according to Expression (7) is enhanced, while the update frequency decreases. As a result, the followability with respect to the actual changes in the SOC decreases instead of a contraction of a fluctuation range of the SOCn of the target cell calculated in every processing cycle. In this embodiment, for example, the value which is 1 or more and is equal to or less than a specified value such as 100 is set as the behavior coefficient G1.

Furthermore, the behavior coefficient G2 is a coefficient relating to the absolute value of the battery current I in the aforementioned Expression (6) and relates to the degree of influence of the buttery current I on the smoothing processing. Specifically, when the value of the behavior coefficient G2 is small, the degree of influence caused by the battery current I on the real difference value ΔSOCn(t) calculated according to Expression (7) becomes low. As a result, the behavior of SOCn of the target cell which is calculated in every processing cycle becomes hardly susceptible to the influence by the battery current I. On the other hand, when the value of the behavior coefficient G2 is large, the degree of influence caused by the battery current I on the real difference value ΔSOCn(t) calculated according to Expression (7) becomes high. As a result, regarding the SOCn of the target cell which is calculated in every processing cycle, if the absolute value of the battery current I is large, the safety increases; and if the absolute value of the battery current I is small, the update frequency becomes high. However, the period of time during which the absolute value of the battery current I remains to be large does not normally continue for long time. So, even if the value of the behavior coefficient G2 is set to be large to a certain degree, it is possible to secure appropriate update frequency with respect to the SOCn of the target cell. In this embodiment, for example, the value equal to or more than 0 is set as the behavior coefficient G2.

The battery status estimation apparatus 110 according to this embodiment stores, for example, values according to the properties of each cell 401 of the assembled battery 400 as the values of the aforementioned behavior coefficients G1, G2 in the storage unit 120 in advance. Incidentally, the values of the behavior coefficients G1, G2 which change according to the battery temperature T, the battery current I, the degree of degradation of each cell 401, and so on may be stored, as map information, in the storage unit 120 and the values of the behavior coefficients G1, G2 may be decided by referring to this map information.

The above-described the second embodiment of the present invention further brings about the following operational advantage (4) in addition to (1) to (3) explained in the first embodiment.

(4) The battery status estimation apparatus 110 includes the weight coefficient operation unit 115 that calculates the weight coefficient W on the basis of the absolute value of the battery current I flowing through the target cell and the internal resistance value R of the target cell. The moving average processing included in the smoothing processing executed in step S80 is the processing for weight-adding the temporary difference ΔSOCnx between the SOCnx and SOCave of this time, and the real difference ΔSOCn(t−1) after the smoothing processing used for the arithmetic operation of the SOC value of the target cell of last time according to Expression (7) by using the weight coefficient W. Consequently, the arithmetic operation accuracy of the SOC value of the target cell can be enhanced.

Third Embodiment

Next, a third embodiment of the present invention will be explained. In this embodiment, an explanation will be provided about an example where the battery status estimation apparatus 110 sets a permissible value of the battery current I for the execution of the smoothing processing; and if the electric current which exceeds this permissible value flows through the assembled battery 400, the smoothing processing will not be executed. Incidentally, the configuration of the battery system 1000 and the configurations of the measurement unit 200 and the assembled battery 400 according to this embodiment are similar to those explained with reference to FIG. 1 and FIG. 2, respectively, so that an explanation about them is omitted below.

Figure 8:
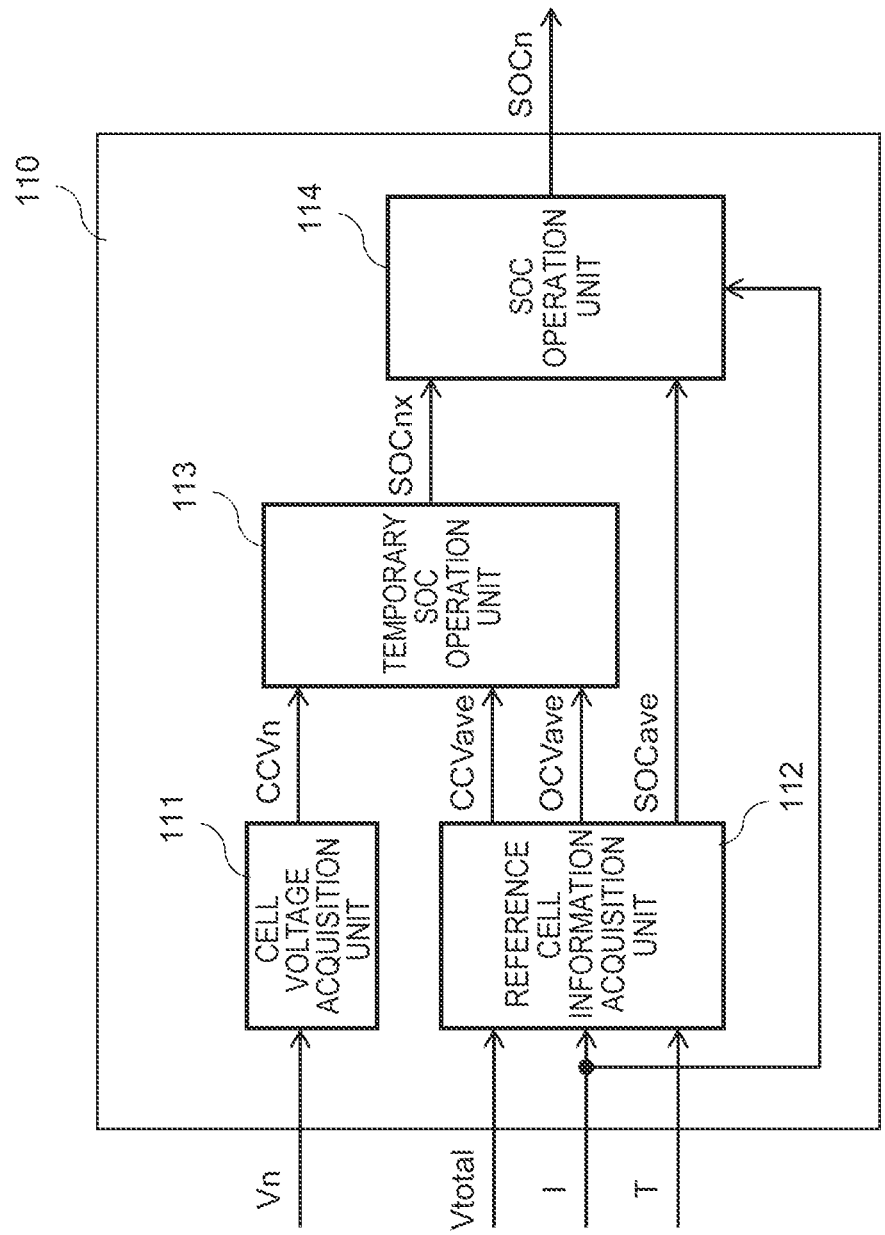
FIG. 8 is a functional block diagram illustrating the details of a battery status estimation apparatus according to a third embodiment of the present invention.

FIG. 8 is a functional block diagram illustrating the details of the battery status estimation apparatus 110 according to the third embodiment of the present invention. The battery status estimation apparatus 110 according to this embodiment has the respective functional blocks of the cell voltage acquisition unit 111, the reference cell information acquisition unit 112, the temporary SOC operation unit 113, and the SOC operation unit 114 which are explained in the first embodiment; and the battery current I is also input to the SOC operation unit 114. Besides this, the functional blocks of the third embodiment are similar to those in the first embodiment in FIG. 3.

In this embodiment, the SOC operation unit 114 judges whether or not to execute the smoothing processing on the basis of the battery current I. When it is determined to not execute the smoothing processing, the SOC operation unit 114 retains the SOC value found by the processing executed last time with respect to each cell 401 and uses it as the processing result of this time.

Figure 9:
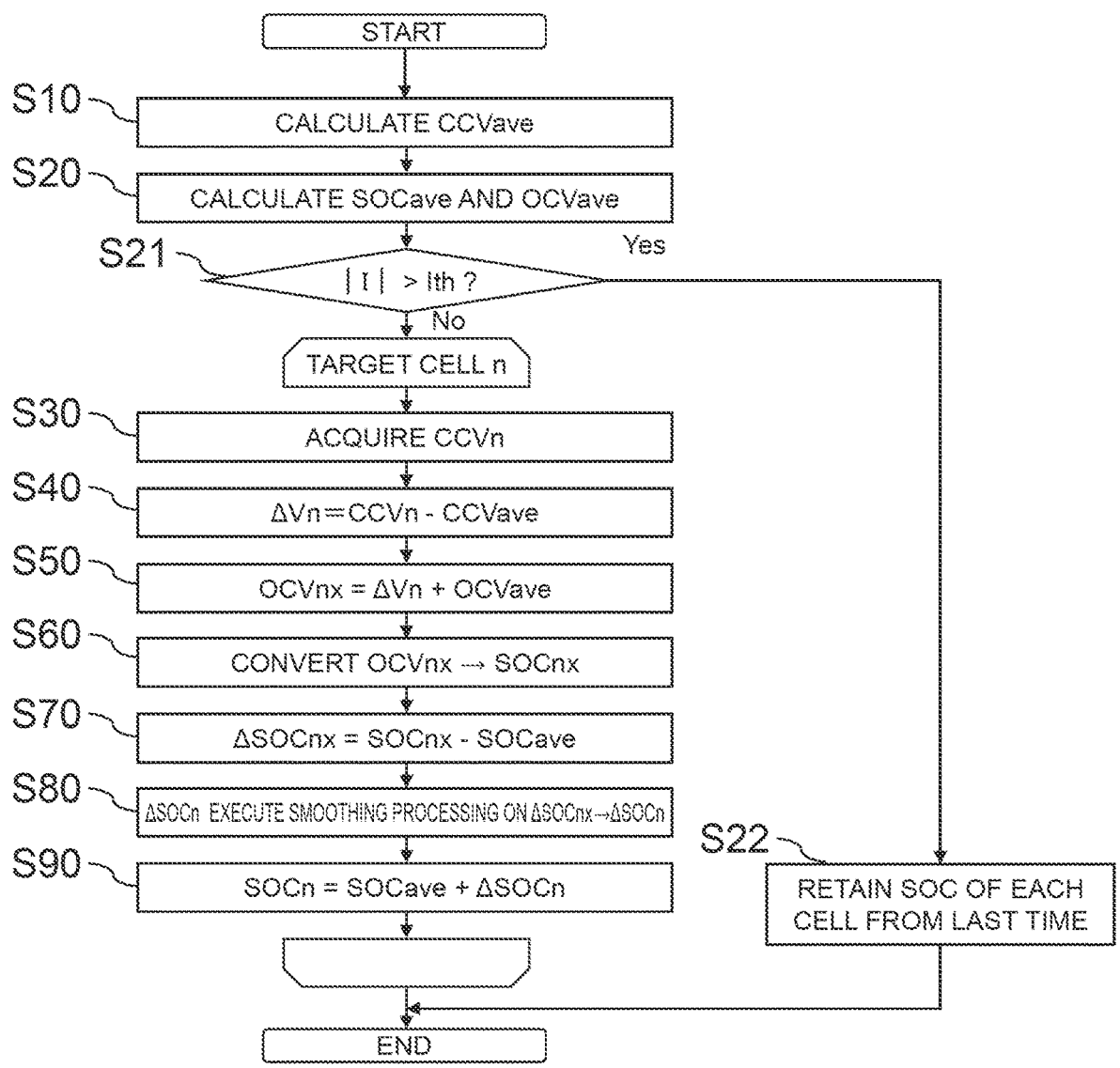
FIG. 9 is a diagram illustrating a processing flow of the battery status estimation apparatus according to the third embodiment of the present invention.

FIG. 9 is a diagram illustrating a processing flow of the battery status estimation apparatus 110 according to the third embodiment of the present invention. The battery status estimation apparatus 110 according to this embodiment estimates the state of charge of each cell 401 by executing the processing flow illustrated in FIG. 9 in every specified processing cycle when the assembled battery 400 is in the energized state.

In each of steps S10 to S20, processing similar to that explained in the first embodiment is executed.

In step S21, the SOC operation unit 114 judges whether the absolute value of the battery current I is larger than a specified electric current threshold value Ith or not. If the absolute value of the battery current I exceeds the electric current threshold value Ith, the processing proceeds to step S22; and If the absolute value of the battery current I does not exceed the electric current threshold value Ith, the processing proceeds to step S30.

If the processing proceeds from step S21 to step S30, processing similar to that explained in the first embodiment is executed in each of steps S30 to S90 by setting each cell 401 of the assembled battery 400 as the target cell. When the processing in S30 to S90 has been successfully executed on all the cells 401 as the target cell, the battery status estimation apparatus 110 terminates the processing flow in FIG. 9.

On the other hand, when the processing proceeds from step S21 to step S22, the SOC operation unit 114 retains the value of the SOC of each cell, which was found in the previous processing, in step S22. In this case, the SOC operation unit 114 does not execute the smoothing processing; and after executing the processing in step S22, the battery status estimation apparatus 110 terminates the processing flow in FIG. 9.

The above-described third embodiment of the present invention further brings about the following operational advantage (5) in addition to (1) to (3) explained in the first embodiment.

(5) When the absolute value of the battery current I which flows through the target cell exceeds the specified value, the SOC operation unit 114 retains the SOC value of last time without executing the smoothing processing. Consequently, when a large electric current flows through the target cell and an error in the cell voltage CCVn acquired by the cell voltage acquisition unit 111 thereby becomes large according to an error in the internal resistance of the target cell, the arithmetic operation accuracy of the SOC value of the target cell can be enhanced by not executing the smoothing processing.

Incidentally, the above-described third embodiment is designed so that when the absolute value of the battery current I which flows through the target cell exceeds the specified value, the SOC value of last time is retained without executing the smoothing processing; however, it is possible to use other conditions besides the above to judge whether or not to execute the smoothing processing. For example, a time change amount of the battery current I which flows through the target cell is measured; and if an absolute value of the time change amount exceeds a specified value, the SOC value of last time may be retained without executing the smoothing processing. By doing so, an operational advantage similar to the aforementioned operational advantage (5) can be also achieved. Furthermore, other conditions may be used to judge whether or not to execute the smoothing processing.

Fourth Embodiment

Next, a fourth embodiment of the present invention will be explained. In this embodiment, an explanation will be provided about an example where the battery status estimation apparatus 110 judges whether the real difference value ΔSOCn after the smoothing processing, which is found by the SOC operation unit 114, has changed suddenly or not; and if it determined that the real difference value ΔSOCn has changed suddenly, change amount limitation processing for limiting its change amount is executed. Incidentally, the configuration of the battery system 1000 and the configurations of the measurement unit 200 and the assembled battery 400 according to this embodiment and the functional blocks of the battery status estimation apparatus 110 are similar to those explained with reference to FIG. 1 to FIG. 3, respectively, so that an explanation about them is omitted below.

Figure 10:
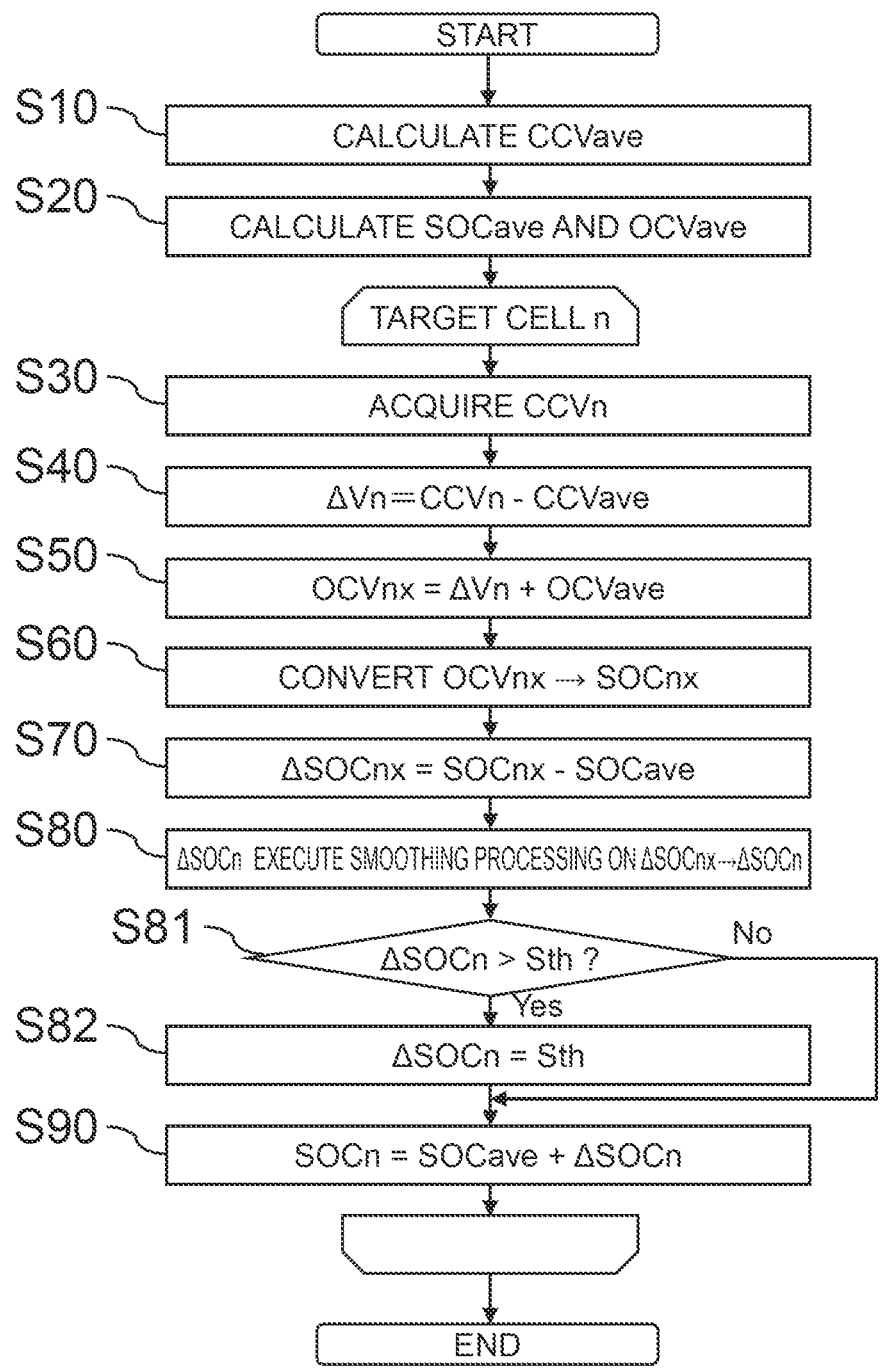
FIG. 10 is a diagram illustrating a processing flow of a battery status estimation apparatus according to a fourth embodiment of the present invention.

FIG. 10 is a diagram illustrating a processing flow of the battery status estimation apparatus 110 according to the fourth embodiment of the present invention. The battery status estimation apparatus 110 according to this embodiment estimates the state of charge of each cell 401 by executing the processing flow illustrated in FIG. 10 in every specified processing cycle when the assembled battery 400 is in the energized state.

In each of steps S10 to S80, processing similar to that explained in the first embodiment is executed.

In step S81, the SOC operation unit 114 judges whether the real difference value ΔSOCn after the smoothing processing, which is calculated in step S80, is larger than a specified difference threshold Sth or not. If the real difference value ΔSOCn exceeds the difference threshold Sth, the processing proceeds to step S82; and if the real difference value ΔSOCn does not exceed the difference threshold Sth, the processing proceeds to step S90.

When the processing proceeds from step S81 to step S82, the real difference value ΔSOCn after the smoothing processing, which is calculated in step S80, is replaced with the difference threshold Sth in step S82. Consequently, the real difference value ΔSOCn after the smoothing processing is limited so that it becomes equal to or less than the difference threshold Sth. After executing the processing in step S82, the SOC operation unit 114 calculates the SOCn which is the SOC value of the target cell by executing the processing in step S90 by using the real difference value ΔSOCn after the limitation of replacement with the difference threshold Sth.

When the processing in S30 to S90 has been successfully executed on all the cells 401 as the target cell, the battery status estimation apparatus 110 terminates the processing flow in FIG. 10.

The above-described fourth embodiment of the present invention further brings about the following operational advantage (6) in addition to (1) to (3) explained in the first embodiment.

(6) The SOC operation unit 114 executes the change amount limitation processing for limiting the real difference value ΔSOCn after the smoothing processing to the specified value or less. Consequently, if a sudden change of ΔSOCn which should not actually occur in the assembled battery 400 where the plurality of cells 401 are connected serially is mistakenly calculated due to a measurement error or the like, the arithmetic operation accuracy of the SOC value of the target cell can be enhanced by limiting this sudden change.

Fifth Embodiment

Next, a fifth embodiment of the present invention will be explained. In the aforementioned first embodiment, the explanation has been provided about the example where the battery status estimation apparatus 110 acquires average values of CCV, OCV, and SOC of each cell 401 of the entire assembled battery 400 as the CCV, OCV, and SOC values of the reference cell. On the other hand, in the fifth embodiment explained below, an explanation will be provided about an example where a specific cell 401 is set as a reference cell and the CCV, OCV, and SOC values of that reference cell are acquired. Incidentally, the configuration of the battery system 1000 and the configurations of the measurement unit 200 and the assembled battery 400 according to this embodiment are similar to those explained with reference to FIG. 1 and FIG. 2, respectively, so that an explanation about them is omitted below.

Figure 11:
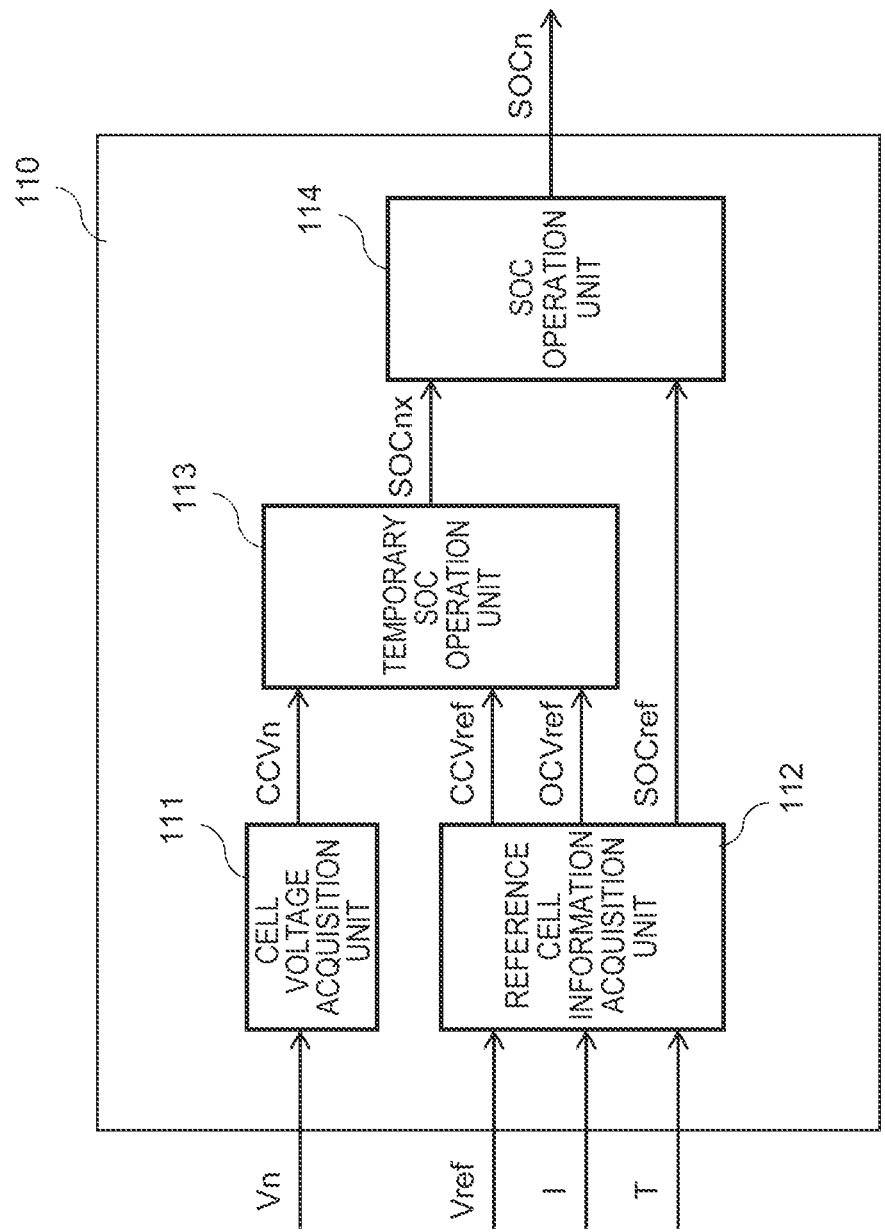
FIG. 11 is a functional block diagram illustrating the details of a battery status estimation apparatus according to a fifth embodiment of the present invention.

FIG. 11 is a functional block diagram illustrating the details of the battery status estimation apparatus 110 according to the fifth embodiment of the present invention. The battery status estimation apparatus 110 according to this embodiment has the respective functional blocks of the cell voltage acquisition unit 111, the reference cell information acquisition unit 112, the temporary SOC operation unit 113, and the SOC operation unit 114 which are explained in the first embodiment.

In this embodiment, the reference cell information acquisition unit 112 sets a specified cell 401, among the plurality of cells 401 included in the assembled battery 400, as the reference cell and acquires a cell voltage Vref of that reference cell when the assembled battery 400 is in the energized state, the battery current I and the battery temperature T which are measured by the measurement unit 200. Then, the acquired cell voltage Vref is output as a reference cell voltage CCVref indicating a closed circuit voltage (CCV) of the reference cell. Furthermore, an open circuit voltage (OCV) and an SOC value of that reference cell are calculated on the basis of the acquired cell voltage Vref, battery current I, and battery temperature T and these calculation results are output as the open circuit voltage OCVref of the reference cell and the state of charge of the reference cell SOCref, respectively.

Incidentally, the reference cell information acquisition unit 112 should preferably set, as the reference cell, a cell 401 which can acquire the values of OCV and SOC with as high accuracy as possible. For example, if a cell 401 corresponding to an installation position of the temperature sensor in the temperature measurement unit 213 is set as the reference cell, the temperature of that cell 401 can be measured accurately and, therefore, the OCV of that cell 401 can be calculated with high accuracy. Also, the SOC can be calculated from that OCV with high accuracy.

Alternatively, a cell 401 regarding which the CCV was measured at the timing closest to the measurement timing of the battery current I, from among the plurality of cells 401 of the assembled battery 400 regarding which the CCV is sequentially measured in every specified cycle by the cell voltage acquisition unit 111, may be set as the reference cell. Consequently, the measurement timing of the battery current I is substantially synchronized with the CCV measurement timing of that cell 401, so that the OCV can be calculated from the CCV of that cell 401 with high accuracy by using the following equivalent circuit expression (8). Also, the SOC can be calculated from that OCV with high accuracy.

$$CCV = OCV \times 1 \times R \qquad (8)$$

Incidentally, besides the example explained above, the reference cell information acquisition unit 112 can set an arbitrary cell 401 as the reference cell and acquire CCVref, OCVref, and SOCref with respect to that reference cell.

Figure 12:
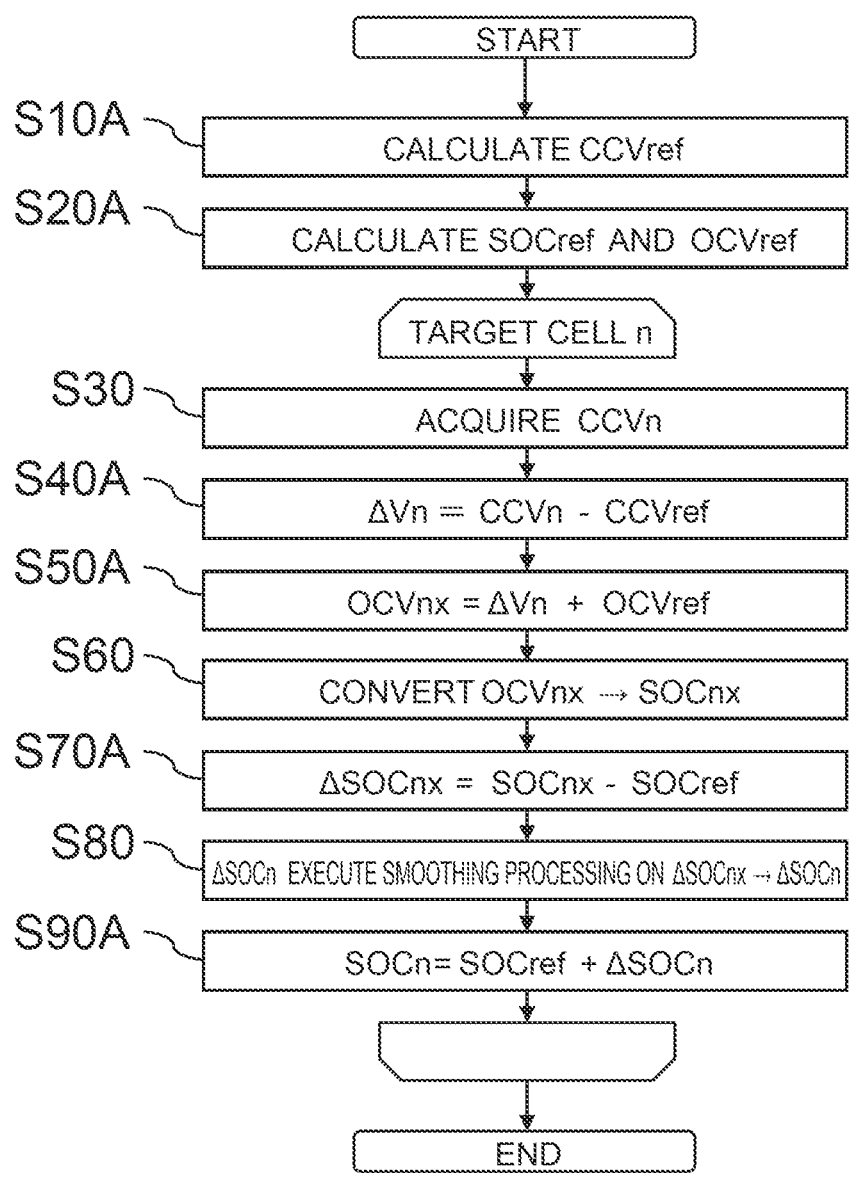
FIG. 12 is a diagram illustrating a processing flow of the battery status estimation apparatus according to the fifth embodiment of the present invention.

FIG. 12 is a diagram illustrating a processing flow of the battery status estimation apparatus 110 according to the fifth embodiment of the present invention. The battery status estimation apparatus 110 according to this embodiment estimates the state of charge of each cell 401 by executing the processing flow illustrated in FIG. 12 in every specified processing cycle when the assembled battery 400 is in the energized state.

In step S10A, the reference cell information acquisition unit 112 acquires the reference cell voltage CCVref. Under this circumstance, the reference cell information acquisition unit 112 selects a preset reference cell from among the plurality of cells 401 of the assembled battery 400 from the above-described viewpoint and acquires the measurement result of the cell voltage of that reference cell from the measurement unit 200. Then, the reference cell information acquisition unit 112 outputs the acquired value of the cell voltage as the reference cell voltage CCVref to the temporary SOC operation unit 113.

In step S20A, the reference cell information acquisition unit 112 calculates the state of charge of the reference cell SOCref and the cell voltage OCVref in the de-energized state of the reference cell. Under this circumstance, the reference cell information acquisition unit 112 estimates the resistance value R of the reference cell, for example, on the basis of the battery temperature T acquired from the measurement unit 200 and finds OCVref corresponding to the CCVref acquired in step S10A by using the aforementioned equivalent circuit expression (8). Then, the SOCref can be calculated from the calculation result of the OCVref by using the relationship between the OCV and the SOC of the reference cell which is included in the characteristic information stored in the storage unit 120. Incidentally, the SOCref and the OCVref may be calculated respectively by other methods. When the SOCref and the OCVref have been calculated successfully by any one of the methods, the reference cell information acquisition unit 112 outputs the calculated values of the OCVref and the SOCref to the temporary SOC operation unit 113 and the SOC operation unit 114, respectively.

After executing processing similar to that explained in the first embodiment in step S30, the temporary SOC operation unit 113 calculates a cell voltage difference ΔVn between the target cell and the reference cell in step S40A. Under this circumstance, the temporary SOC operation unit 113 calculates the cell voltage difference ΔVn by subtracting the reference cell voltage CCVref, which is input from the reference cell information acquisition unit 112 in step S10A, from the cell voltage CCVn of the target cell which is input from the cell voltage acquisition unit 111 in step S30. Specifically speaking, the cell voltage difference ΔVn is found according to the following Expression (1A) in step S40A.

$$\Delta Vn = CCVn - CCVref \quad (1A)$$

In step S50A, the temporary SOC operation unit 113 calculates OCVnx which is a temporary OCV value of the target cell. Under this circumstance, the temporary SOC operation unit 113 calculates the OCVnx by adding the OCVref calculated in step S20A to the cell voltage difference ΔVn calculated in step S40A. Specifically speaking, the OCVnx is found according to the following Expression (2A) in step S50A.

$$OCVnx = \Delta Vn + OCVref \quad (2A)$$

After executing processing similar to that explained in the first embodiment in step S60, the SOC operation unit 114 calculates a temporary SOC difference value ΔSOCnx of the target cell relative to the reference cell in step S70A. Under this circumstance, the SOC operation unit 114 calculates the ΔSOCnx by subtracting the value of SOCref, which was input from the reference cell information acquisition unit 112 in step S20A, from the value of SOCnx which was input from the temporary SOC operation unit 113 in step S60. Specifically speaking, the ΔSOCnx is found according to the following Expression (3A) in step S70A.

$$\Delta SOCnx = SOCnx - SOCref \quad (3A)$$

After executing processing similar to that explained in the first embodiment in step S80, the SOC operation unit 114 calculates the SOC value of the target cell in step S90A by using the result of the smoothing processing in step S80. Under this circumstance, the SOC operation unit 114 calculates the SOCn which is the SOC value of the target cell by adding the real difference value ΔSOCn after the smoothing processing, which was found in step S80, to the value of SOCref which was input from the reference cell information acquisition unit 112 in step S20A. Specifically speaking, the SOCn is found according to the following Expression (5A) in step S90A.

$$SOCn = SOCref + \Delta SOCn \quad (5A)$$

After the SOCn with respect to the target cell is calculated in step S90A, the processing returns to step S30 and the processing in S30 to S90A is repeated. When the processing in S30 to S90A has been successfully executed on all the cells 401 as the target cell, the battery status estimation apparatus 110 terminates the processing flow in FIG. 12.

The above-described fifth embodiment of the present invention further brings about the following operational advantage (7) in addition to (1) to (3) explained in the first embodiment.

(7) The assembled battery 400 has the temperature sensor installed at the position corresponding to at least any one of the plurality of cells 401. The reference cell information acquisition unit 112 sets, as the reference cell, the cell 401 corresponding to the installation position of the temperature sensor. Alternatively, the cell voltage acquisition unit 111 acquires the closed circuit voltage of each cell 401 of the assembled battery 400, which is sequentially measured in every specified cycle, as the closed circuit voltage CCVn of the target cell. Under this circumstance, the reference cell information acquisition unit 112 sets the cell 401 regarding which the closed circuit voltage was measured at the timing closest to the measurement timing of the battery current I, among the plurality of cells 401 of the assembled battery 400, as the reference cell. Consequently, the closed circuit voltage CCVref and the open circuit voltage OCVref of the reference cell, and the state of charge of the reference cell SOCref can be acquired accurately.

Sixth Embodiment

Next, a sixth embodiment of the present invention will be explained. In this embodiment, an explanation will be provided about an example of a battery system for performing balancing of each cell of the assembled battery 400 on the basis of the calculation result of the SOC of each cell by the battery status estimation apparatus 110.

Figure 13:
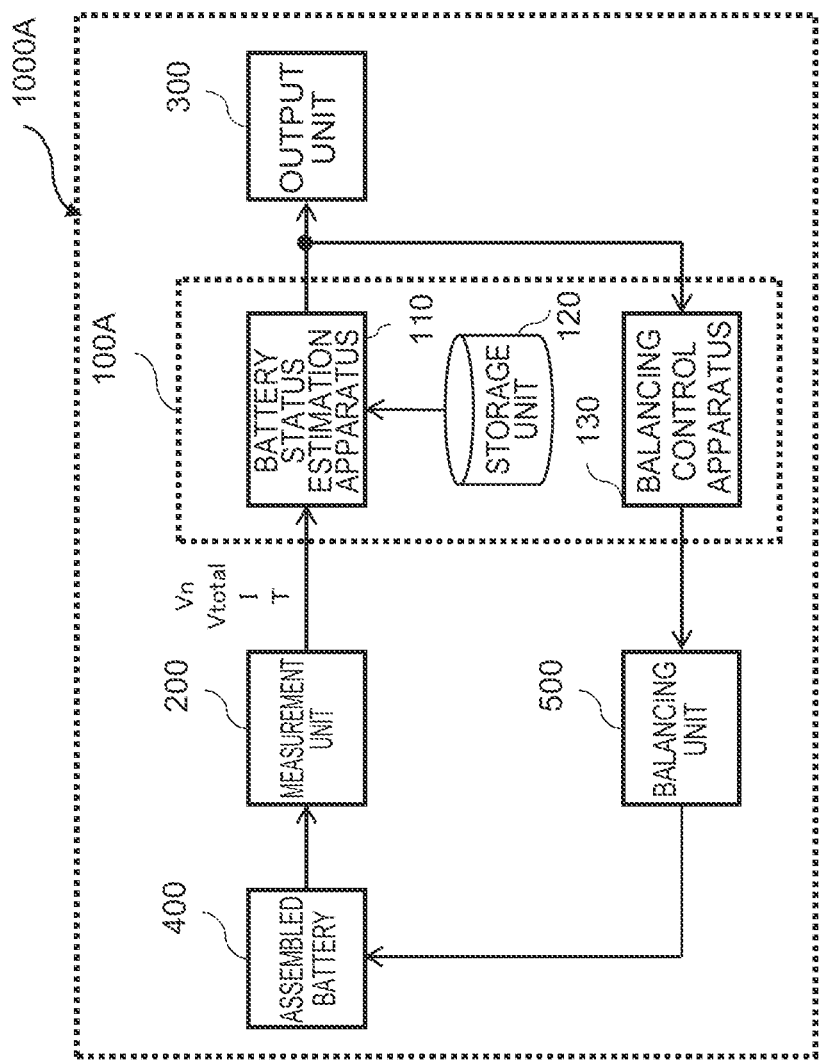
FIG. 13 is a block diagram illustrating the configuration of a battery system according to a sixth embodiment of the present invention.

FIG. 13 is a block diagram illustrating the configuration of a battery system 1000A according to the sixth embodiment of the present invention. The battery system 1000A according to this embodiment includes a battery control apparatus 100A, the measurement unit 200, the output unit 300, the assembled battery 400, and a balancing unit 500. Incidentally, the measurement unit 200, the output unit 300, and the assembled battery 400 are the same as those of the battery system 1000 explained in the first embodiment, so that an explanation about them are omitted below.

The battery control apparatus 100A is an apparatus for controlling actions of the assembled battery 400 and includes the battery status estimation apparatus 110, the storage unit 120, and a balancing control apparatus 130. The battery status estimation apparatus 110 is an apparatus for calculating the SOC of each cell of the assembled battery 400 and may be any one of the battery status estimation apparatuses 110 explained respectively in the first to fifth embodiments. The storage unit 120 stores characteristic information which can be known in advance such as the internal resistance R, the polarization voltage Vp, the charging efficiency, the permissible electric current, and the full capacity of each cell of the assembled battery 400 as explained in the first embodiment.

The balancing control apparatus 130 outputs a signal for controlling discharging time of each cell to the balancing unit 500 on the basis of the SOC value of each cell found by the battery status estimation apparatus 110. The balancing unit 500 has a plurality of balancing switches (which are not illustrated in the drawing) which are provided respectively corresponding to the respective cells of the assembled battery 400. Actions of each balancing switch are controlled according to an input signal from the balancing control apparatus 130. Consequently, balancing control of the assembled battery 400 is performed and variations of the SOC of each cell are suppressed.

The above-described sixth embodiment of the present invention further brings about the following operational advantage (8) in addition to (1) to (7) explained in each of the first to fifth embodiments.

(8) The battery control apparatus 100A includes the battery status estimation apparatus 110 and the balancing control apparatus 130 that controls balancing of the assembled battery 400 on the basis of the SOC value of each cell which is found by the battery status estimation apparatus 110. Consequently, variations of each cell in the assembled battery 400 can be reduced with certainty by making use of the calculation result of the SOC of each cell by the battery status estimation apparatus 110.

Incidentally, the respective first to sixth embodiments described above may be combined arbitrarily.

Each of the embodiments and various kinds of variations described above are merely examples and the present invention is not limited to the content of such embodiments or variations unless the features of the invention are impaired. Also, the various embodiments and variations have been explained above, but the present invention is not limited to the content of these embodiments or variations. Any other aspects which can be thought of within the scope of the technical idea of the present invention are also included within the scope of the present invention.

The disclosure content of the following basic priority application is incorporated herein by reference: Japanese Patent Application No. 2018-142471 (filed on Jul. 30, 2018).

REFERENCE SIGNS LIST

100: battery control apparatus
110: battery status estimation apparatus
111: cell voltage acquisition unit
112: reference cell information acquisition unit
113: temporary SOC operation unit
114: SOC operation unit
115: weight coefficient operation unit
120: storage unit
130: balancing control apparatus
200: measurement unit
210: cell voltage measurement unit
211: total voltage measurement unit
212: electric current measurement unit
213: temperature measurement unit
300: output unit
400: assembled battery
401: cells
500: balancing unit
1000: battery system

The invention claimed is:

1. An apparatus coupled to an assembled battery with a plurality of serially-connected cells and for setting any one of the plurality of cells as a target cell and estimating a state of charge of the target cell, the apparatus comprising:
a cell voltage acquisition unit that acquires a measurement result of a closed circuit voltage of the target cell; a reference cell information acquisition unit that sets a reference cell with respect to the plurality of cells and acquires a closed circuit voltage and an open circuit voltage of the reference cell and a reference SOC value representing a state of charge of the reference cell;
a temporary SOC operation unit that finds a temporary SOC value representing a temporary state of charge of the target cell on the basis of the closed circuit voltage of the target cell and the closed circuit voltage and the open circuit voltage of the reference cell; and
an SOC operation unit that finds an SOC value representing the state of charge of the target cell by using a result of smoothing processing executed on a difference between the temporary SOC value and the reference SOC value.

2. The battery status estimation apparatus according to claim 1,
wherein when an absolute value of an electric current flowing through the target cell exceeds a specified value, the SOC operation unit retains the SOC value representing the state of charge of the target cell without executing the smoothing processing.

3. The battery status estimation apparatus according to claim 1,
wherein when an absolute value of a time change amount of the electric current flowing through the target cell exceeds a specified value, the SOC operation unit retains the SOC value representing the state of charge of the target cell without executing the smoothing processing.

4. The battery status estimation apparatus according to claim 1, wherein the smoothing processing includes at least either one of moving average processing and filtering processing using a specified digital filter.

5. The battery status estimation apparatus according to claim 4, comprising a weight coefficient operation unit that calculates a weight coefficient on the basis of the absolute value of the electric current flowing through the target cell and an internal resistance value of the target cell,
wherein the moving average processing is processing for weight-adding the difference before the smoothing processing and the difference after the smoothing processing used for an arithmetic operation of the SOC value representing the state of charge of the target cell by using the weight coefficient.

6. The battery status estimation apparatus according to claim 1, wherein the SOC operation unit executes change amount limitation processing for limiting a difference after the smoothing processing to a specified value or smaller.

7. The battery status estimation apparatus according to claim 1, wherein the reference cell information acquisition unit acquires an average value of closed circuit voltages and an average value of state of charges of the plurality of cells, respectively, as the closed circuit voltage and the reference SOC value of the reference cell and finds an open circuit voltage of the reference cell on the basis of the acquired reference SOC value.

8. The battery status estimation apparatus according to claim 1,
wherein a temperature sensor is installed at a position corresponding to at least any one of the plurality of cells in the assembled battery; and
wherein the reference cell information acquisition unit sets a cell corresponding to an installation position of the temperature sensor as the reference cell.

9. The battery status estimation apparatus according to claim 1,
wherein the cell voltage acquisition unit acquires a closed circuit voltage of each cell of the assembled battery, which is sequentially measured in every specified cycle, as the closed circuit voltage of the target cell; and
wherein the reference cell information acquisition unit sets, as the reference cell, a cell regarding which the closed circuit voltage is measured at timing closest to timing to measure the electric current flowing through the assembled battery, from among the plurality of cells.

10. A battery control apparatus comprising:
the battery status estimation apparatus stated in claim 1; and a balancing control apparatus for controlling balancing of the assembled battery on the basis of the SOC value of each cell which is found by the battery status estimation apparatus.

\* \* \* \* \*